(12) United States Patent  
Makarewicz

(10) Patent No.: US 8,461,846 B2
(45) Date of Patent: Jun. 11, 2013

(54) VEHICLE BATTERY TESTING

(75) Inventor: Nathan P Makarewicz, Oxford, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 432 days.

(21) Appl. No.: 12/915,159

(22) Filed: Oct. 29, 2010

(65) Prior Publication Data

US 2012/0105067 A1     May 3, 2012

(51) Int. Cl.
*G01N 27/416*     (2006.01)

(52) U.S. Cl.
USPC ........................................................ 324/433

(58) Field of Classification Search
USPC .................................. 324/426, 427, 430, 433
See application file for complete search history.

(56) References Cited

U.S. PATENT DOCUMENTS

| | | | |
|---|---|---|---|
| 6,404,163 B1* | 6/2002 | Kapsokavathis et al. | 320/104 |
| 2005/0088144 A1* | 4/2005 | Pacholok et al. | 320/131 |
| 2009/0265057 A1* | 10/2009 | Chinnadurai et al. | 701/29 |

* cited by examiner

*Primary Examiner* — Edward Tso

(57) ABSTRACT

A method of estimating a state of charge of a battery in a vehicle undergoing a vehicle assembly process. The method may include the steps of: installing the battery in the vehicle; employing a sensor mounted in the vehicle to automatically sense battery net amp hours during at least a portion of the vehicle assembly process; storing the net amp hours in a control module mounted in the vehicle; mounting a data link connector in the vehicle to provide communication with the controller; temporarily connecting a tool connector of a battery test assembly to the data link connector and transmitting the stored net amp hours data to the battery test tool from the control module; and comparing the net amp hours to a predetermined maximum net amp hours to estimate if the state of charge of the battery is acceptable.

8 Claims, 2 Drawing Sheets

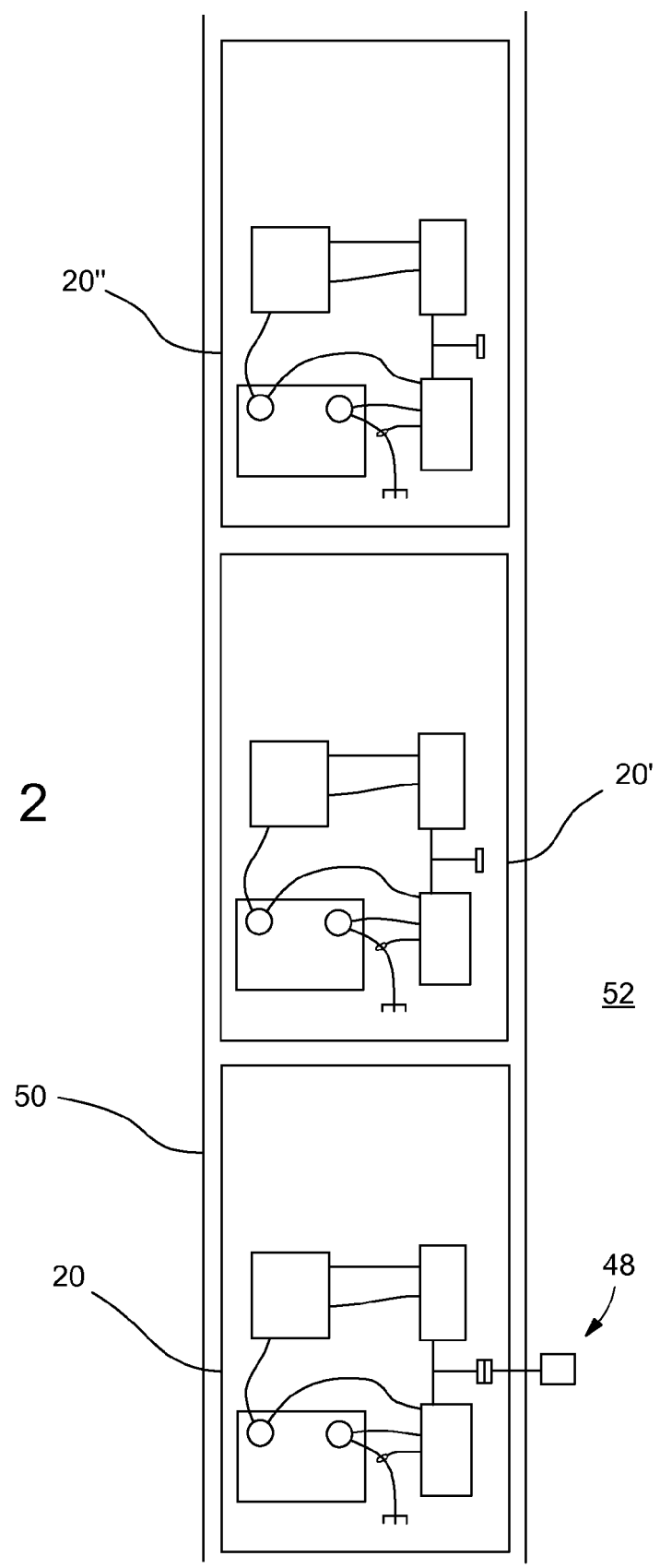

VEHICLE BATTERY TESTING

BACKGROUND OF INVENTION

The present invention relates generally to battery testing for a battery in a vehicle at an assembly plant.

During assembly of vehicles at assembly plants, the battery used for, among other things, vehicle starting, may be drained somewhat due to activities related to vehicle assembly. If the battery for a vehicle is accidentally drained too much during the assembly process, then this vehicle may end up becoming a warranty concern.

Conventional battery testing is not typically done on the vehicle assembly line because such methods for determining the state of charge of the battery, such as conductance testing and open circuit voltage testing, are not able to be conducted at typical vehicle assembly line speed. They typically need direct access to the battery and its terminals, which is not always easy to do quickly in an assembly line environment. Moreover, these tests may result in inaccurate or inconsistent results that are a poor indicator of actual battery state of charge when one tries to do them quickly to minimize the effect on assembly line speed.

As a result, some vehicle assembly plants use electrical power drop equipment at certain points along the assembly line to minimize the drain on the battery or exhaust collection equipment at some points on the assembly line so that the engine can be running (providing electrical power from the alternator) to minimize battery drain. But these are relatively expensive and add to the assembly line cost and complexity.

SUMMARY OF INVENTION

An embodiment contemplates a method of estimating a state of charge of a battery in a vehicle undergoing a vehicle assembly process, the method comprising the steps of: installing the battery in the vehicle; employing a sensor mounted in the vehicle to automatically sense battery net amp hours during at least a portion of the vehicle assembly process; storing the net amp hours in a control module mounted in the vehicle; mounting a data link connector in the vehicle to provide communication with the controller; temporarily connecting a tool connector of a battery test assembly to the data link connector and transmitting the stored net amp hours data to the battery test tool from the control module; and comparing the net amp hours to a predetermined maximum net amp hours to estimate if the state of charge of the battery is acceptable.

An advantage of an embodiment is to have a quick, easy, relatively accurate, consistent, and inexpensive method of estimating a charge in a vehicle battery during or after assembly of a vehicle in a vehicle assembly plant. The vehicle battery charge estimation where net amp hours is read from the controller can be accomplished quickly on an assembly line and gives an accurate estimation of the state of charge of the battery before it is shipped from the assembly plant. Moreover, the data link connector is legislated to be located in a convenient location for connection to the battery test tool. The battery terminals do not need to be accessible or disconnected from vehicle components by the assembly line worker in order to complete this test. If the net amp hours exceed a predetermined amount, then remedial action can be taken, which minimizes the risk of warranty concerns from a battery that has been drained too much during vehicle assembly. The reading of the net amp hours does not require stable electrical consumption at the time of measurement, does not require removal of surface charge to obtain an accurate reading, does not require the battery to be disconnected, and is not subject to temperature variation, as may be the case with other types of direct battery testing.

In addition, the net amp hours reading can be conducted at various points along the assembly line to determine which points in the assembly process contribute the most to battery drain. This can be done quickly in order to avoid interference with the speed of the assembly line. With this information, the particular assembly process may be reviewed and adjusted to reduce the battery drain to an acceptable level. This may allow for the elimination of electrical power drops and exhaust collection, reducing the cost and complexity of vehicle assembly.

BRIEF DESCRIPTION OF DRAWINGS

FIG. 2 is a schematic diagram of the vehicle of FIG. 1 on a vehicle assembly line.

DETAILED DESCRIPTION

Figure 1:
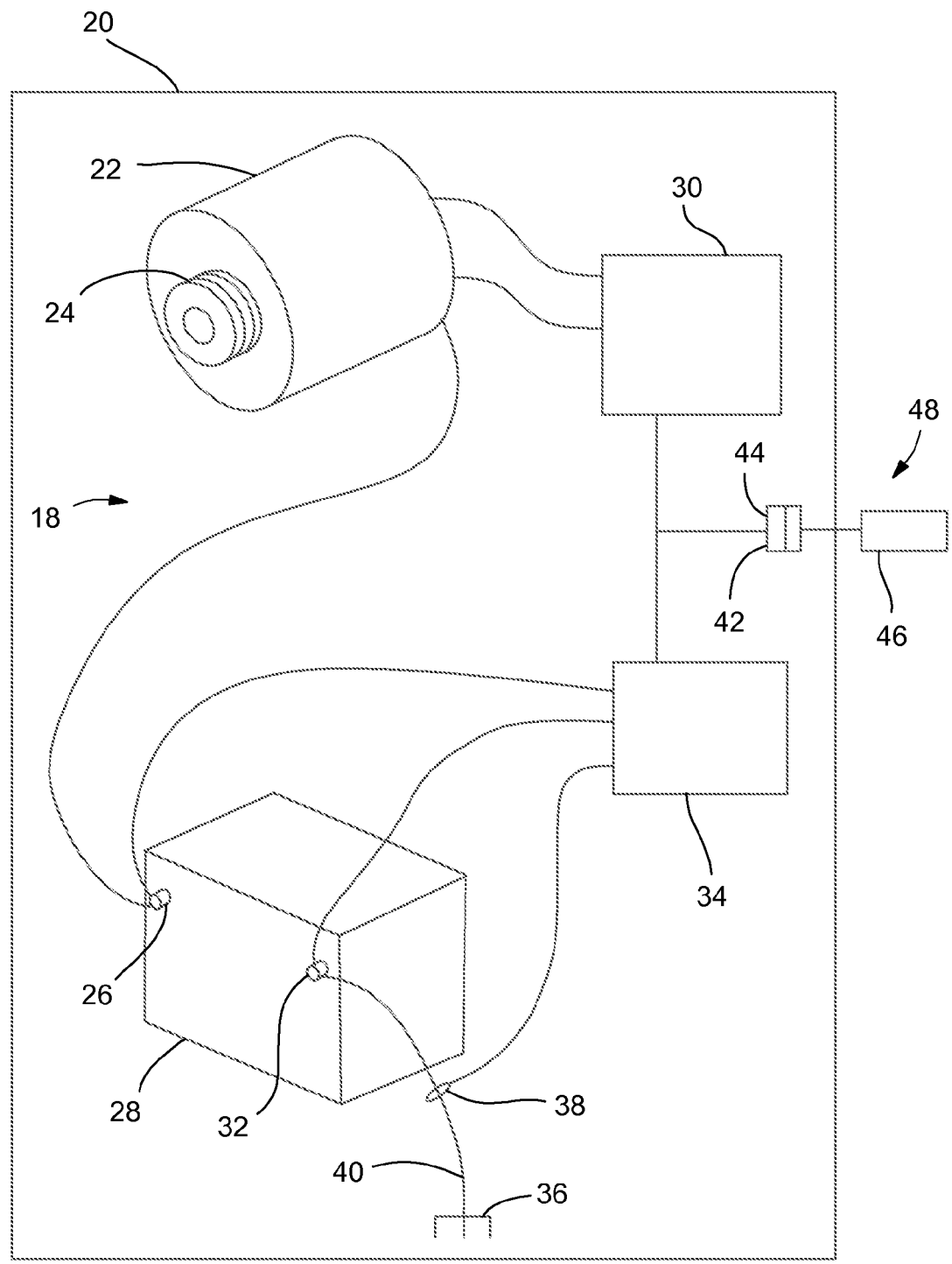
FIG. 1 is a schematic diagram of a vehicle connected to a battery test tool.

Referring to FIG. 1, a vehicle, indicated generally at 20, is shown. The vehicle 20 includes a vehicle electrical system 18 having an alternator (generator) 22, which may have a pulley 24 that is driven by a vehicle engine (not shown). The alternator 22 may be electrically connected to a positive terminal 26 of a vehicle battery 28 and to a powertrain (engine) control module 30. The positive terminal 26 and a negative terminal 32 of the battery 28 may be connected to a body control module 34. The negative terminal 32 is also connected to an electrical ground 36. An electrical current sensor 38 is mounted to detect electrical current through a ground wire 40 and is connected to the body control module 34. The body control module 34 collects net amp hours information from the electrical current sensor 38.

The body control module 34 is in communication with the powertrain control module 30. A data (diagnostic) link connector 42 is configured to receive data from the control modules 30, 34. Selected data stored in the control modules 30, 34 can be retrieved through the data link connector 42. This may be a serial date link with the control modules 30, 34. A tool connector 44 of a battery test assembly 48 is plugged into the data link connector 42. This connector connects to a battery test tool 46 of the battery test assembly 48. The data link connector 42 is located in the vehicle 20 for easy access. The tool connector 44 is configured to easily plug into and be unplugged from the data link connector 42. The battery test tool 46 is configured to communicate with and receive net amp hour data from the body control module 34.

FIG. 2 schematically shows the vehicle 20 of FIG. 1 on a vehicle assembly line 50 in a vehicle assembly plant 52, with the battery test assembly 48 connected to the vehicle 20 and ready for conducting a battery test. Other vehicles 20' and 20" are also located on the assembly line 50 and are ready for testing after the current vehicle test is completed. While shown on an assembly line, the test may be conducted after the vehicle 20 leaves the assembly line.

The battery test operation in the assembly plant 52 will now be discussed with reference to FIGS. 1 and 2. As the vehicle 20 moves through the assembly process, at some point in this process, the vehicle electrical system 18, including the battery 28, is installed and the components connected. After this point in the vehicle assembly process, electrical power may be taken from the battery 28 as any of the electric components in the vehicle are temporarily activated. As this vehicle electrical power is used during assembly of the vehicle 20, the electrical current sensor 38 will sense this and the body control module 34 will store the net amp hours.

When the vehicle 20 completes or is near completion of its assembly, the tool connector 44 is plugged into the data link connector 42. This is a quick and easy process, so the assembly line does not have to be slowed to account for this—the vehicles may continue moving at ordinary vehicle line rate. The battery test tool 46 will then read, from the body control module 34, the net amp hours. The net amp hours is then compared to a predetermined limit that correlates to the maximum acceptable battery drainage. If the net amp hours exceeds this limit, then the vehicle 20 fails this test because the battery 28 may not have an acceptable state of charge for leaving the assembly plant 52. Appropriate action may then be taken to assure the vehicle 20 has an acceptable state of charge. For example, a battery charger may be employed, or the vehicle engine may be run for a certain amount of time to assure that the battery state of charge is acceptable.

Alternatively, or in addition to the end of assembly line test, the battery test assembly 48 may be connected to vehicles 20 at various points along the assembly line 50 to read the net amp hours consumed. This data may then be stored and used for plant process control purposes to determine the locations where high battery drain may be occurring. Vehicle assembly processes may then be changed in order to reduce the battery drain, if need be.

While certain embodiments of the present invention have been described in detail, those familiar with the art to which this invention relates will recognize various alternative designs and embodiments for practicing the invention as defined by the following claims.

What is claimed is:

1. A method of estimating a state of charge of a battery in a vehicle undergoing a vehicle assembly process, the method comprising the steps of:
   (a) installing the battery in the vehicle;
   (b) employing a sensor mounted in the vehicle to automatically sense battery net amp hours during at least a portion of the vehicle assembly process;
   (c) storing the net amp hours in a control module mounted in the vehicle;
   (d) mounting a data link connector in the vehicle to provide communication with the controller;
   (e) temporarily connecting a tool connector of a battery test assembly to the data link connector and transmitting the stored net amp hours data to the battery test tool from the control module; and
   (f) comparing the net amp hours to a predetermined maximum net amp hours to estimate if the state of charge of the battery is acceptable.

2. The method of claim 1 further comprising the step of: (g) if the net amp hours is greater than the predetermined maximum net amp hours, then charging the battery prior to shipping the vehicle from a vehicle assembly plant.

3. The method of claim 1 wherein steps (e) and (f) are further defined by the vehicle assembly process being completed before steps (e) and (f) are carried out.

4. The method of claim 1 wherein steps (e) and (f) are further defined by the vehicle assembly process not being completed before steps (e) and (f) are carried out.

5. The method of claim 1 wherein step (b) is further defined by the sensor being an electrical current sensor operatively engaging a ground wire connected to a negative terminal of the battery.

6. The method of claim 5 wherein step (c) is further defined by the control module being a body control module.

7. The method of claim 1 wherein step (c) is further defined by the control module being a body control module.

8. A method of estimating a state of charge of a battery in a vehicle undergoing a vehicle assembly process, the method comprising the steps of:
   (a) installing the battery in the vehicle;
   (b) employing a sensor mounted in the vehicle to automatically sense battery net amp hours during at least a portion of the vehicle assembly process;
   (c) storing the net amp hours in a control module mounted in the vehicle;
   (d) mounting a data link connector in the vehicle to provide communication with the controller;
   (e) temporarily connecting a tool connector of a battery test assembly to the data link connector and transmitting the stored net amp hours data to the battery test tool from the control module; and
   (f) determining an amount of net amp hours used during a particular vehicle assembly process based on the net amp hours data transmitted to the battery test tool.

* * * * *